(12) United States Patent
Gusev et al.

(10) Patent No.: US 8,743,455 B2
(45) Date of Patent: Jun. 3, 2014

(54) OPTICAL PULSE TRANSMITTER

(75) Inventors: Yuri Gusev, Älvsjö (SE); Mikael Hertzman, Sollentuna (SE); Evgeny Vanin, Enskede (SE); Christian Grässer, Vallentuna (SE)

(73) Assignee: Trimble AB, Danderyd (SE)

( * ) Notice: Subject to any disclaimer, the term of this patent is extended or adjusted under 35 U.S.C. 154(b) by 232 days.

(21) Appl. No.: 13/381,047

(22) PCT Filed: Jun. 30, 2009

(86) PCT No.: PCT/EP2009/058186
§ 371 (c)(1),
(2), (4) Date: Mar. 5, 2012

(87) PCT Pub. No.: WO2011/000411
PCT Pub. Date: Jan. 6, 2011

(65) Prior Publication Data
US 2012/0162749 A1    Jun. 28, 2012

(51) Int. Cl.
*H01S 5/06* (2006.01)
(52) U.S. Cl.
USPC .......................... 359/344; 372/43.01
(58) Field of Classification Search
USPC ............. 398/182; 372/43.01, 38.02; 359/344
See application file for complete search history.

(56) References Cited

U.S. PATENT DOCUMENTS

| | | | |
|---|---|---|---|
| 4,766,597 A | 8/1988 | Olshansky | |
| 7,545,839 B2 * | 6/2009 | Giorgi et al. | 372/38.02 |
| 2004/0041758 A1 * | 3/2004 | Kurusu | 345/82 |
| 2004/0258114 A1 * | 12/2004 | Murata et al. | 372/38.02 |
| 2004/0258115 A1 * | 12/2004 | Murata et al. | 372/38.02 |
| 2005/0002429 A1 * | 1/2005 | Nakatani | 372/38.02 |
| 2009/0175302 A1 | 7/2009 | Bazzani et al. | |

FOREIGN PATENT DOCUMENTS

| | | |
|---|---|---|
| EP | 0989736 A1 | 3/2000 |
| JP | 01-048481 A | 2/1989 |
| JP | 2008-141127 A | 6/2008 |

OTHER PUBLICATIONS

Sergey N. Vainshtein et al., "A high-power picosecond near-infrared laser transmitter module," *Rev. Sci. Instrum.*, vol. 71, No. 11, pp. 4039-4044 (Nov. 2000).
International Search Report.
Lanz et al. "High power gain-switched laser diode using a superfast GaAs avalanche transistor for pumping," Applied Physics Letters 89, 081122, Aug. 24, 2006.

* cited by examiner

*Primary Examiner* — Mark Hellner
(74) *Attorney, Agent, or Firm* — Harness, Dickey & Pierce, P.L.C.

(57) ABSTRACT

It is disclosed a method for driving a laser diode such as to enable mitigation or elimination of so called spiking effects related to the number of injected carriers in the laser overshooting the equilibrium value at the beginning of the lasing process. In this manner, among other things, the efficiency of a master oscillator power amplifier that may be utilized in range finding applications will be improved. It is further disclosed an optical pulse transmitter comprising such a laser diode.

21 Claims, 9 Drawing Sheets

OPTICAL PULSE TRANSMITTER

TECHNICAL FIELD

The present invention generally relates to range finding. In particular, the present invention relates to a method of driving a laser diode and an optical pulse transmitter.

BACKGROUND ART

The art of surveying, or range finding, involves the determination of unknown positions, surfaces or volumes of objects using measurements of angles and distances. The determined angles and distances from a measuring instrument to points under survey may be used to calculate the coordinates of surveyed points relatively the measuring instrument. In order to make these measurements, an optical surveying instrument or geodetic instrument frequently comprises an electronic distance measuring (EDM) device which may be integrated in a so-called total station, see FIG. 1. A distance measuring total station combines electronic and optical components and is furthermore in general provided with a computer or control unit with writable information for controlling the measurements to be performed and for storing data obtained during the measurements. Preferably, the total station calculates the position of a target in a fixed ground-based coordinate system. Such a total station may comprise a telescope, which for example may be arranged with cross-hairs for sighting a target. Angle of rotation of the telescope, as well as angle of inclination of the telescope, may be measured relative to the target. Total stations comprising a camera are also known.

In conventional EDM, a light beam is emitted as a light pulse towards a target, and light reflected by the target is subsequently detected at the optical surveying instrument, such as a total station. Processing of the detected signal enables determination of distance to the target by means of, e.g., time-of-flight (TOF) or phase modulation techniques. Using the TOF technique, the time of flight of a light pulse that travels from the surveying instrument (the EDM device) to a target, is reflected at the target and returns to the surveying instrument (the EDM device) is measured, on the basis of which distance may be calculated. The power loss of the received signal determines the maximum possible range. Using a phase modulation technique, light of different frequencies is emitted from the surveying instrument to the target, whereby reflected light pulses are detected and the distance is calculated based on the phase difference between emitted and received pulses. As mentioned in the foregoing, once the angles and distances have been measured, the actual position of a surveyed target may be calculated.

In a conventional scanner, for example intended for use in industrial, surveying and/or construction applications, or in other applications, the light beam may be guided over a number of positions of interest at the surface of the target using a beam steering function. A light pulse is emitted towards each of the positions of interest and the light pulse that is reflected from each one of these positions is detected in order to determine the distance to each one of these positions. For example, using a LIDAR (Light Detection and Ranging) scanner, properties of scattered light may be measured to find range and/or other information of a distant target. In general, the distance to an object or surface is determined using laser pulses.

For increasing the measurement range in the TOF ranging applications, use of a master oscillator power amplifier (MOPA) may be advantageous since a high peak power can be achieved in the transmitted pulse, thus resulting in a longer range and higher measurement rate due to a higher signal-to-noise ratio. Higher output power is also advantageous in the phase modulation systems for the same reason. In a MOPA, a master laser is employed in combination with an optical amplifier used to amplify the output of the master laser. The master laser is often referred to as a seed laser. By using an optical amplifier to boost the output, the requirements on the seed laser may be mitigated, which allows reaching higher wavelength stability and spatial quality of the beam for the transmitter. A particular type of MOPA is realized with a microstructure semiconductor seed laser diode and an optically pumped fiber amplifier, which sometimes is referred to as a master oscillator fiber amplifier (MOFA).

To reach a high enough accuracy of distance measurements, short pulses should be used. Normally, optical pulses with duration $t_p$ of 1 to 50 ns are used, depending on application. Transmitters utilizing subnanosecond pulses are also known (cf., e.g., S. N. Vainshtein et. al., Rev. Sci. Instrum. vol. 71, no. 11, p. 4039-4044 (2000)). To provide optical pulses of duration of $t_p$, the carrier life time in the laser $t_L$ should be about $t_p$ or shorter.

Let us assume that we want to obtain a 1 ns long optical pulse from the microstructure laser and that a laser with carrier lifetime $t_L \ll 1$ ns is used. Using a microstructure laser diode as a seed laser requires an appropriate electrical laser driver, in particular, a pulsed laser driver for TOF applications. Driving the seed laser with nanosecond or sub-nanosecond electrical pulses causes an intensive relaxation oscillation process, also called "spiking" in case relaxation oscillations are limited to one pulse, before lasing can be established. The origin of relaxation oscillations is directly related to the recombination processes in semiconductors (see, e.g., chapter 4 in "Handbook of semiconductor lasers and photonic integrated circuits", Ed. Y. Suematsu and A. R. Adams, Chapman & Hall, 1994). In particular, characteristic time and amplitude of relaxation oscillations depend on spontaneous and stimulated emission relaxation times $t_s$ and $t_{ph}$, as well as on number of carriers and photons (see, e.g., p. 266 in "Handbook of semiconductor lasers and photonic integrated circuits", Ed. Y. Suematsu and A. R. Adams, Chapman & Hall, 1994).

According to Einstein's quantum theory of light, there are two categories of light emission processes (also described in the book of Suematsu and Adams). The transition probability of the first kind of light emission process is proportional to the existing photon density. This is called the stimulated emission process. The transition probability of the second kind of light emission process is independent of the photon density and is called the spontaneous emission process. When applying a short current pulse to the semiconductor laser diode, a large number of carriers are injected in the active area. If the concentration of carriers is high enough, which is above the threshold level, population inversion is achieved, wherein stimulated emission commences, which in turn results in a growing number of photons, i.e. the lasing starts. However, the density of photons of the first kind, corresponding to the stimulated emission, is close to zero in the beginning of the process, and growing of the number of photons is very slow. Because of that, the increasing concentration of carriers under the current pumping does not immediately result in an increase of the photon density and the concentration of carriers overshoots the level corresponding to the equilibrium lasing condition, under which the growth in the number of carriers is compensated by the radiative recombination process. After the photon density becomes large enough to intensify the optical recombination process, the number of carriers drops down to the equilibrium level and a spiking pulse is emitted from the seed laser. The spiking pulse is amplified by the fiber amplifier and therefore is present in the transmitted signal together with the main, intended optical pulse. The desired pulse shape is thereby distorted which may cause a decrease in the distance measurement accuracy.

While parameters of the main pulse are determined by the amplitude and duration of the driving pulse, both amplitude and start time of the spiking pulse are less predictable. In addition, the spiking pulse has a spectrum different from that of the main pulse, and the spiking pulse might further be spatially different from the main pulse, which may cause additional errors in the distance and angle measurements. Therefore, it is desired to eliminate—or at least mitigate—the spiking process.

The spiking, or relaxation oscillations, may be mitigated in different ways. First, the laser may be driven in continuous wave (CW) mode, while the optical power is varied by means of a modulator, for example an acousto-optic modulator. This approach suffers from limited extinction ratio at the output as well as high insertion loss to the modulator. Also, the maximum output power is limited.

Another, more general, approach is to develop laser diodes producing less relaxation oscillation by optimizing the laser structure. For instance, width and length of the optical resonator has large impact on wavelength and power stabilizing. Presently available semiconductor laser diodes have highly optimized structure, so that they may provide single-mode output in a wide range of driving current. That significantly reduces relaxation oscillations while driving the laser above the threshold, but spiking is still present if the driving current rises sharply from zero.

A third way to mitigate spiking is to continuously operate the seed laser above the lasing threshold, though not in the CW mode. For ranging applications, however, such a solution is typically not an option. First, most ranging instruments and devices are battery-driven, thus in general having a limited supply of energy, while driving the laser above the threshold adds significantly to the power consumption. Second, continuous driving of the laser above the threshold causes continuous illumination of the target between the pulses, though at lower intensity, which, in turn, may reduce contrast and decrease measurement accuracy. The third and most serious drawback of continuously operating the laser above the threshold applies to a seed laser in combination with an optically pumped fiber amplifier as discussed in the above—the continuous application of a bias current exceeding the lasing threshold generally results in poor efficiency.

SUMMARY OF THE INVENTION

An object of the present invention is to solve the above mentioned problems and to provide a method and apparatus for driving a laser diode such that the effect of relaxation oscillation described above is mitigated.

To this end, there is provided a method of driving a laser with a pre-formed current pulse consisting of two pulses, a main driving pulse and a preceding pulse having a lower amplitude than that of the main driving pulse, for creating a light beam emitted as a light pulse towards a target, the distance to which is to be measured by a surveying instrument in which the laser is incorporated. The signal preceding the main drive signal will in the following be referred to as the pre-drive signal. The generated pre-drive signal may be formed such that spiking effects are mitigated both at the laser optical output and at the output of a fiber amplifier.

In a semiconductor laser, an applied current step above the threshold level will cause population inversion, whereby stimulated emission will commence. However, since the stimulated optical transition probability is proportional to the number of photons, which may be very low at the start of the current pulse, the population inversion level may temporarily exceed the equilibrium level. After the number of photons becomes large enough, the optical recombination process intensifies and the number of carriers falls down to the equilibrium level, whereby a spiking pulse is emitted. The larger the deviation of the number of carriers from the equilibrium level, the more intense the spiking effect will be. The increase in the stimulated emission is effectively delayed relatively the current step by the time needed to create a large enough number of stimulated emission photons. This characteristic time, $t_c$, is specific for a particular laser and depends on a number of parameters such as carrier recombination time, time for establishing an optical mode in the resonator etc. The time $t_c$ is also closely related to the inverse of the critical modulation frequency $\omega_c^{-1}$: The higher the modulation speed that the laser can provide, the shorter the characteristic time $t_c$.

In order to mitigate or eliminate the spiking effects, the pre-drive signal should be formed such that its current level is kept above the laser current threshold value for such duration of time that the number of carriers injected in the laser approaches an equilibrium level before the main drive signal is applied.

The pre-drive signal of the present invention results in a slow increase in the number of injected carriers up to a value close to the laser threshold value, at which the number of stimulated emission photons is already large enough for making the delay between the current change and the change in the number of photons very short. Subsequently, when the main current pulse is applied, the effect of overshooting with respect to number of injected carriers is small and spiking may effectively be mitigated or avoided.

The inventors have realized that by applying the pre-drive signal to the laser prior to applying the main drive signal of the laser, undesired relaxation oscillation pulses present in the optical output may be eliminated.

Further, there is provided an optical pulse transmitter which is driven with a pre-drive signal and a main drive signal as discussed hereinabove.

The laser may be operated in either of a single mode of its resonator or in multiple modes of its resonator. Multi-mode operation of the laser enables for example reaching a higher power compared to a single-mode laser. In this manner, an optical amplifier may not be required in operating the optical pulse transmitter.

According to an exemplifying embodiment, the pulse generator of the optical pulse transmitter may be adapted to form the pre-drive signal such that a resulting optical output signal has an energy content that is less than a predetermined fraction of the energy content of an optical output signal resulting from the main drive signal.

Such a configuration enables for example to reduce the energy consumption of the optical pulse transmitter. At the same time, spiking effects may be mitigated or eliminated. The predetermined fraction may be chosen on the basis of choice of application and/or capacity requirements. For example, in some applications the predetermined fraction may be about 10%. In other applications the predetermined fraction may be considerably lower than 10%.

In an exemplifying embodiment, the optical pulse transmitter comprises an optically pumped amplifier for amplifying a signal provided by the laser diode, thereby producing an optical output signal of the optical pulse transmitter. The laser diode may thus be employed in combination with an optical amplifier. The combination of the laser and the optical amplifier may for example constitute a master oscillator power amplifier (MOPA).

In an exemplifying embodiment, the optical pulse transmitter, or the optically pumped amplifier, comprises a doped fiber amplifier.

The doped fiber amplifier may be adapted to operate in an eye-safe wavelength range. For example, the doped fiber amplifier may be an Er-doped fiber amplifier (EDFA) operating in the wavelength range from about 1530 nm to 1565 nm where eye-safe operation of the laser is possible at high peak power. In general, the doped fiber amplifier may be doped with one or more rare-earth metals, such as Neodymium (Nb), Ytterbium (Yb), Erbium (Er), Thulium (Tb), Praseodymium (Pr) and Holmium (Ho), and may be adapted to operate within the wavelengths of about 1.03-1.10 µm, 1.0-1.1 µm, 1.5-1.6 µm, 1.45-1.53 µm, 1.3 µm and 2.1 µm, respectively. The doped fiber amplifier may be doped with any combination of rare-earth metals.

In the context of some embodiments, by "eye-safe" operation of lasers it is referred to operation of the lasers in a wavelength range where the light emitted from the laser for example cannot penetrate the cornea of a human, thus protecting the retina from damage by the laser light.

The duty cycle of the main drive signal may be less than about 1 percent. Such a configuration may be particularly advantageous for range finding applications.

The duration of the pre-drive signal may be longer than a characteristic time of the laser. As discussed above, the characteristic time of the laser is generally determined by the time needed to create a large enough number of stimulated emission photons.

The pulse generator may be adapted to form the pre-drive signal such that a resulting optical output signal (i.e. resulting from the pre-drive signal) has an amplitude not higher than about 20% of the amplitude of the output optical signal resulting from the main drive signal.

Alternatively or optionally, the pulse generator may be adapted to form the pre-drive signal such that a resulting optical output signal (i.e. resulting from the pre-drive signal) has a duration that is not longer than about 20% of the period of the output optical signal resulting from the main drive signal. Further features of, and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

The present invention will be described in more detail in the following with reference made to the accompanying drawings, on which

DETAILED DESCRIPTION OF EMBODIMENTS OF THE INVENTION

First of all, a prior art surveying instrument in the form of a total station, in which the present invention can be applied, will be briefly described.

Figure 1:
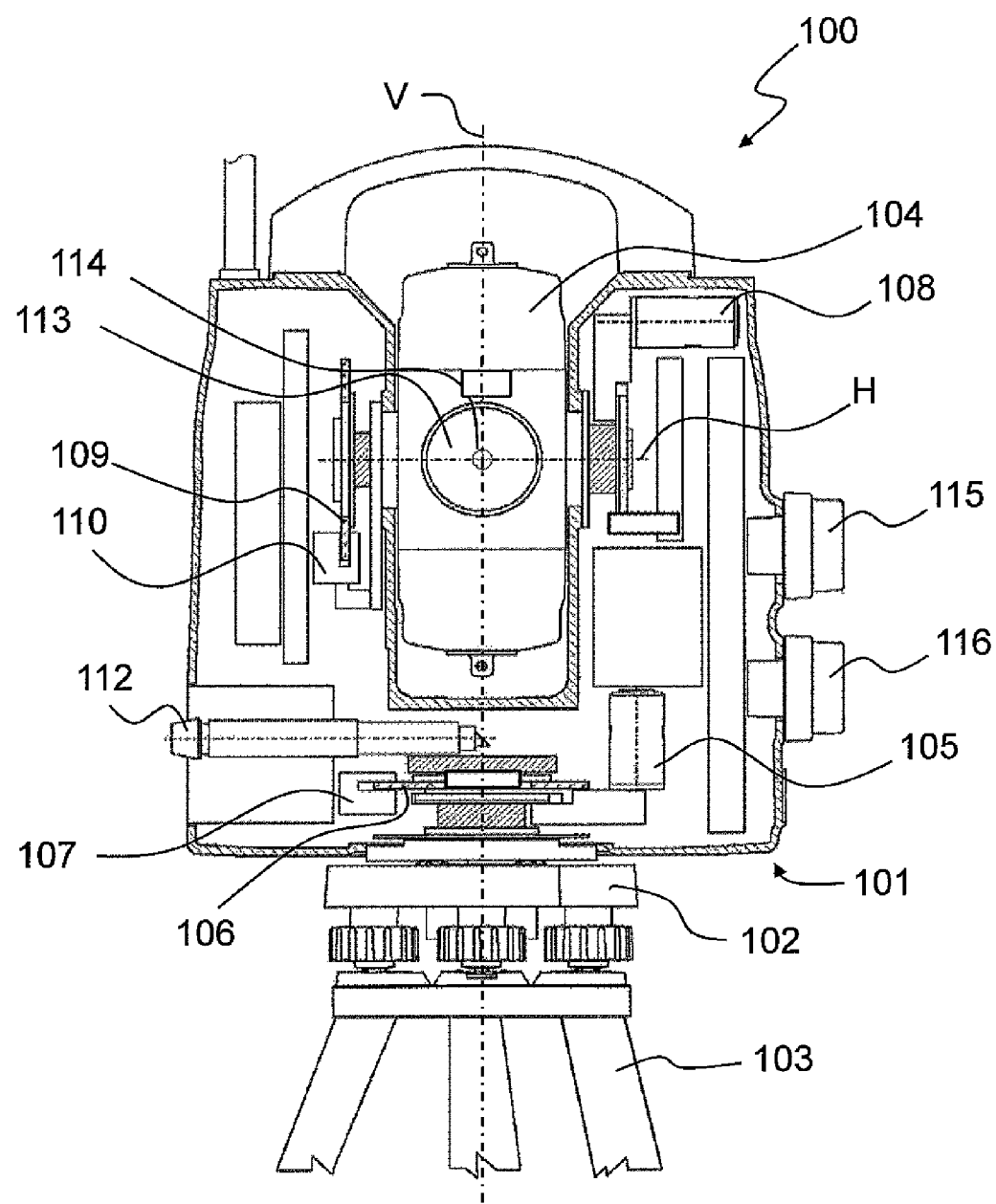
FIG. 1 shows an example of a prior art total station in which the present invention can be applied.

In FIG. 1, there is shown an example of a prior art total station 100 comprising an alidade 101 mounted on a base 102, and having a mounting support structure in the form of a tripod 103. The alidade 101 can be rotated about a vertically oriented rotation axis V, in order to aim the instrument in any desired horizontal direction. In the alidade, there is arranged a center unit 104, which can be rotated about a horizontally oriented rotation axis H, in order to aim the instrument in any desired vertical direction. Measurements made using the total station 100 are typically related to an origin of coordinates located at the intersection between the vertically oriented and the horizontally oriented rotation axes V and H.

For rotation of the alidade about the vertically oriented rotation axis to aim the instrument in any desired horizontal direction, there is provided drive means 105. The rotational position of the alidade 101 is tracked by means of a graduated disc 106 and a corresponding angle encoder or sensor 107. For rotation of the center unit 104 about the horizontally oriented rotation axis, there are provided similar drive means 108, graduated disc 109 and sensor 110. Moreover, the instrument has an optical plummet 112, which gives a downwards view along the vertically oriented rotation axis. The optical plummet is used by the operator to center or position the instrument above any desired point on the ground. The instrument can also be manually operated for aiming towards a desired target using vertical and horizontal motion servo knobs 115 and 116. The means for rotating the instrument is preferably implemented in association with the servo control system for the instrument for controlled activation of the drive motors 105 and 108.

The instrument line of sight is centered at the intersection between the vertical and the horizontal rotation axes, and this can be seen in the figure where these axes cross in the center of a telescope 113 in the center unit 104.

In the telescope, there is provided a light source 114, such as a laser pointer. Preferably, the light source is coaxial with the telescope, even though it could be placed elsewhere such that it instead is eccentric with the telescope. It should be understood that light sources having other wavelengths, e.g. light being invisible to the human eye, may be used. The light source is used for indicating an object to be targeted, in order to perform EDM. The instrument may also comprise a display device for showing the indicated target. The display may be an integral part of the instrument, but more preferably, the display is included in a removable control panel that can be used for remote control of the instrument via short range radio. It is even conceivable that the instrument is fully remote controlled, wherein the display may be in the form of a computer screen located far away from the total station, and wherein information to and from the instrument are transferred over a wireless computer or radio telephone network.

The instrument can also be manually operated for aiming towards a desired target using vertical and horizontal motion servo knobs 115 and 116.

The means for rotating the instrument is preferably implemented in association with the servo control system for the instrument for controlled activation of the drive motors 105 and 108.

Figure 2:
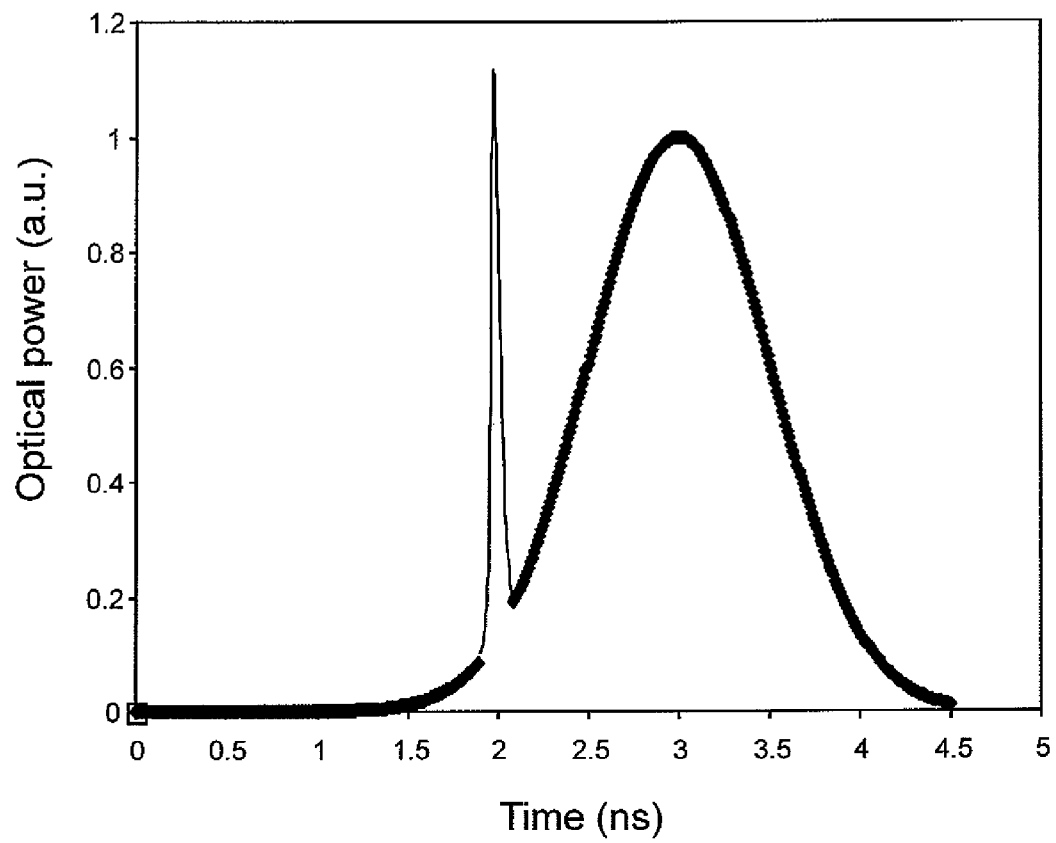
FIG. 2 illustrates the effect of spiking at the output of an optical amplifier.

FIG. 2 illustrates the effect of relaxation oscillations at the output of an optical amplifier. As has been previously described, driving a seed laser with nanosecond or sub-nanosecond electrical pulses may cause a relaxation oscillation process before lasing is established. When applying a current pulse to the laser diode, a large number of carriers are injected in order to achieve population inversion, wherein stimulated emission commences and lasing starts. The relaxation process causes one or more ultra-short spiking pulses on the leading edge of the main pulse which is output from the seed laser and, after amplification in the fiber amplifier, the MOPA itself, see FIG. 2. As can be seen from FIG. 2, the duration of the spiking pulse is fairly short and its edges are rather steep as compared to the main optical pulse. While parameters of the main pulse are determined by the seed laser driver, both amplitude and start time of the spiking pulse are rather defined by internal laser parameters like carrier recombination time, multiplication rate of photons, etc. In addition, the spiking pulse may have a spectrum different from that of the main pulse, and it may further be spatially different from the main pulse. This may cause additional errors in distance measurements. Therefore, it is desired to eliminate—or at least mitigate—the spiking.

In telecommunication applications, this problem is addressed by continuously driving the seed laser above the threshold. As a consequence, carriers are injected to such an extent that the resulting carrier density does not fall below the lasing threshold.

For ranging applications, however, such a simple and straightforward solution is typically not an option. Firstly, many ranging applications use battery-driven devices where energy-saving is essential. Secondly, continuously illuminating a target, though at low intensity, may reduce contrast and, consequently, measurement accuracy. The third and most serious drawback of continuously driving the laser above the threshold applies to using a seed laser in combination with an EDFA as discussed in the foregoing. In case of using a MOPA comprising a seed laser combined with an EDFA, the continuous application of a bias current exceeding the lasing threshold generally results in a very poor efficiency, as will be shown in the following.

Consider an example of a MOPA with rare-earth metal doped fiber amplifier (XDFA) and a seed laser generating rectangular optical pulses of duration $t=1$ ns, period $T=10$ μs, and amplitude varying between $P_0$ and $P_1$. For an ideal XDFA with gain G, average output power $P_{av}$ is $$P_{av}=G*(P_0*(T-t)+P_1*t)/T. \quad (1)$$

In case of $P_0=0$, the optical peak output power is $$P_{pk}=G*P_1=P_{av}*(T-t)/t \approx 10^4*P_{av}. \quad (2)$$

For a non-ideal XDFA, the amplitude of an optical pulse at the output will be slightly reduced due to spontaneous emission (i.e. noise generation) in the amplifier. Still, high signal-to-noise ratio can be reached with a correctly designed XDFA.

A seed laser which is permanently driven above its threshold will accordingly produce a permanently present optical signal at its output $P_0>0$. Since this optical signal forms an input signal for the XDFA, the output peak power of the XDFA will be dramatically reduced. This is due to the fact that the average output power of the XDFA is determined by the pump power which is independent of the optical input signal. For example, assuming that $P_0$ is 10% of $P_1$ at the output of the seed laser (i.e. the extinction ratio is 10), the peak optical power at XDFA output can be calculated as $$P_{pk}=P_{av}*T/(t+0.1*(T-t))\approx P_{av}*T/(0.1*T)=10*P_{av}. \quad (3)$$

Thus, the output peak power will be reduced by a factor 1000 compared to the result achieved in (2) obtained for $P_0=0$. Further, nearly all, about 99.9 percent, of the optical energy emitted by XDFA will be in the parasitic CW signal, which results in an unacceptably low efficiency for use in a battery-driven application.

To increase the efficiency of the MOPA, the seed laser has to be driven with short current pulses starting from a value below the threshold, for example zero, that is in return-to-zero mode. However, this causes a spiking problem. To overcome this problem, the seed laser can be driven according to the method of the present invention, where a pre-drive signal is applied to the seed laser before the main drive signal is applied.

Figure 3:
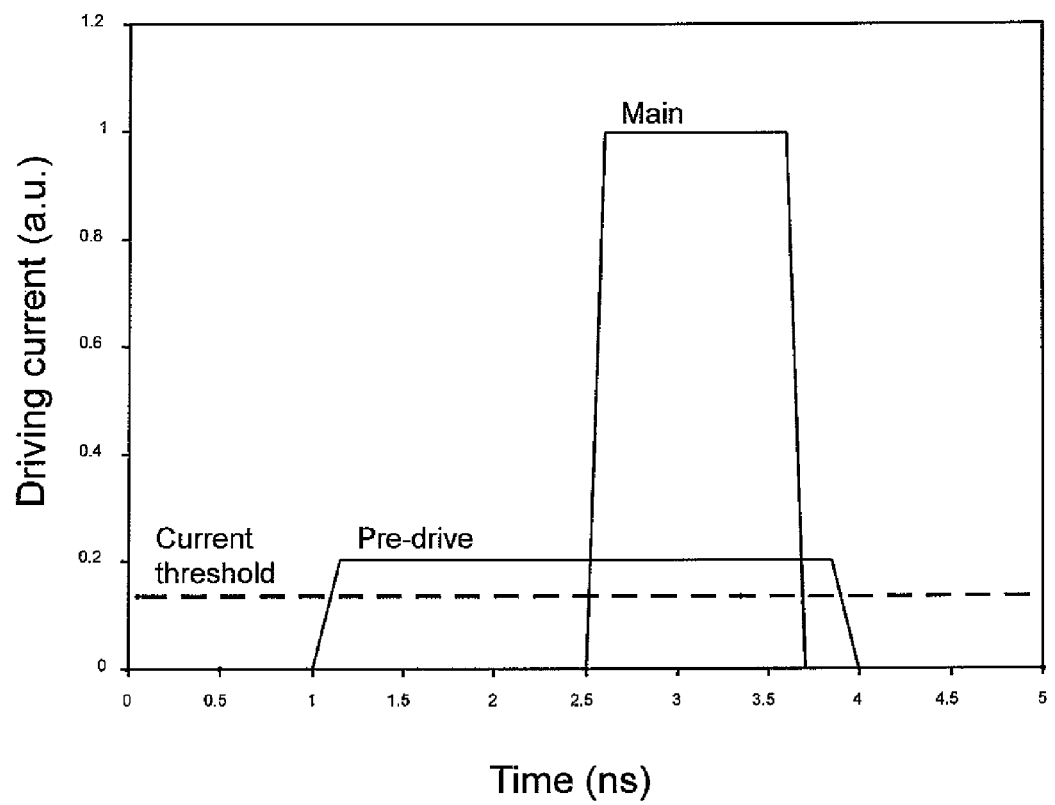
FIG. 3 illustrates an example of a pre-drive signal and a main drive signal.

An example of a main drive (current) signal with a pre-drive signal is given with reference to FIG. 3. The duration of the pre-drive signal is approximately 3.5 ns and its amplitude is 0.2 a.u., whereas the main drive-signal has a duration of about 1 ns and an amplitude of 1 a.u. As depicted in FIG. 3, the pre-drive signal may have an amplitude slightly above the threshold current value for the seed laser. The characteristic time $t_c$ of the seed laser should be much less than 1 ns, otherwise the present driving signal will result in a distorted, much slower optical pulse.

In the particular example of FIG. 3 and assuming $t_c \ll 1$ ns, the energy content of an optical pulse resulting from the pre-drive signal is about 15% of the total energy content of the main and pre-drive signals, which means that about 15% of the optical energy output of the XDFA is wasted.

Obviously, the shorter the pre-drive pulse is, and the lower amplitude it has, the higher the efficiency of XDFA. The lowest amplitude of the pre-drive current pulse is defined by the threshold value. In the best case, the pre-drive current should increase to the threshold value or just above it in order to create a sufficiently large number of photons to intensify the stimulated emission process. The lower limit for the duration of the pre-drive signal is determined by the characteristic time $t_c$ of the particular laser. If the duration time of the pre-drive pulse becomes shorter or comparable to $t_c$, the effect of the pre-drive signal diminishes and then disappears. The upper limit for the pre-drive pulse duration is determined by the desired efficiency of the whole system.

According to an exemplifying embodiment of the present invention, the duration of the pre-drive pulse may be about the same as the duration of the main drive pulse. In that case, the optical efficiency of XDFA would be maximized even in the case of relatively high amplitude of the pre-drive current due to a very short pre-drive pulse. An even shorter pre-drive pulse is, in principle, possible, but generally requires unnecessarily fast driving electronics (e.g. associated with relatively high costs).

The effect of the pre-drive signal on spiking amplitude will be discussed in the following. Assuming that a current step with a maximum value $I_{pk}>I_{th}$ (where $I_{th}$ is the threshold level, or the threshold current value of the seed laser) is applied to the seed laser. The carrier density $N_e$ will increase with the applied current until it reaches the lasing threshold value $N_{e\_th}$. At this point, population inversion is achieved, wherein stimulated emission commences, which in turn results in a growing number of photons. However, the density of stimulated emission photons is close to zero in the beginning of the process, and growing of the number of photons is very slow. Because of that, the increasing concentration of carriers under the current pumping does not immediately result in an increase of the photon density, and the concentration of carriers overshoots the level corresponding to the equilibrium with the number of emitted photons. After the photon density becomes large enough to intensify the optical recombination process, the number of carriers drops down to the equilibrium level and a spiking pulse is emitted from the seed laser. The higher the amplitude of the current step, or the larger the deviation of the number of injected carriers from the threshold value $N_{e\_th}$, the more intense spiking will occur.

To estimate the amplitude of the spiking pulse, a number of laser parameters have to be known, such as the confinement factor, the optical recombination time, the diffusion coefficient, etc. To illustrate the effect of spiking, numerical simulations of carrier density and output optical power for a semiconductor laser have been made using a model including rate equations for the number of carriers and photons. The result for a Gaussian driving pulse without pre-drive is presented in FIG. 4.

Figure 4:
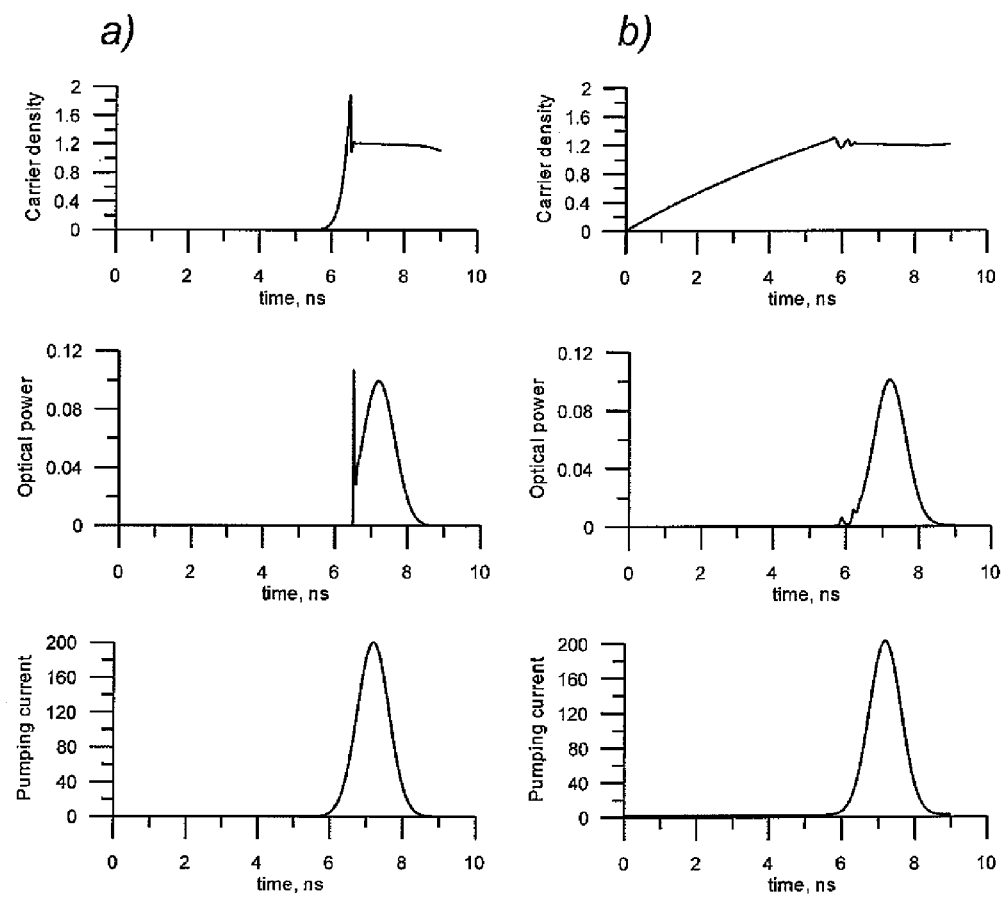
FIG. 4 shows numerical simulations of carrier density and output optical power for a semiconductor laser.

With reference to FIG. 4, on the left-hand side of the drawing, denoted a), the carrier density and the optical power of the laser is presented for an applied current pulse ("pumping current") starting from zero amplitude. The number of injected carriers increases drastically at 6 ns, when the current pulse is applied, and the caused spiking is clearly observed in the optical power curve. On the right-hand side of the drawing, denoted b), the current pulse is starting from a value of 12 just below the threshold value (which is subtle in FIG. 4 due to scaling effects), which results in a slow increase of the number of injected carriers to a value close to the threshold value. At 6 ns, when the main current pulse is applied, the effect of overshooting with respect to number of injected carriers is small and spiking is effectively avoided. In FIG. 4, all quantities on the vertical axes are given in arbitrary units.

Thus, to eliminate the spiking effect, the current in the pre-drive signal should be kept close to the threshold value for such duration of time that the number of injected carriers practically reaches the equilibrium level. In that case, the arriving main pulse will not cause spiking. Preferably, the current in the pre-drive signal should be kept at a value equal to or higher than the laser current threshold value for such duration of time that the number of carriers injected in the laser approaches the equilibrium level as closely as possible, e.g. as closely that is possible and/or desirable to implement. For example, the current in the pre-drive signal may be kept at a value equal to or higher than the laser current threshold value for such a duration of time that the number of carriers injected in the laser approaches the equilibrium level within about 10% of the equilibrium level.

Figure 5A:
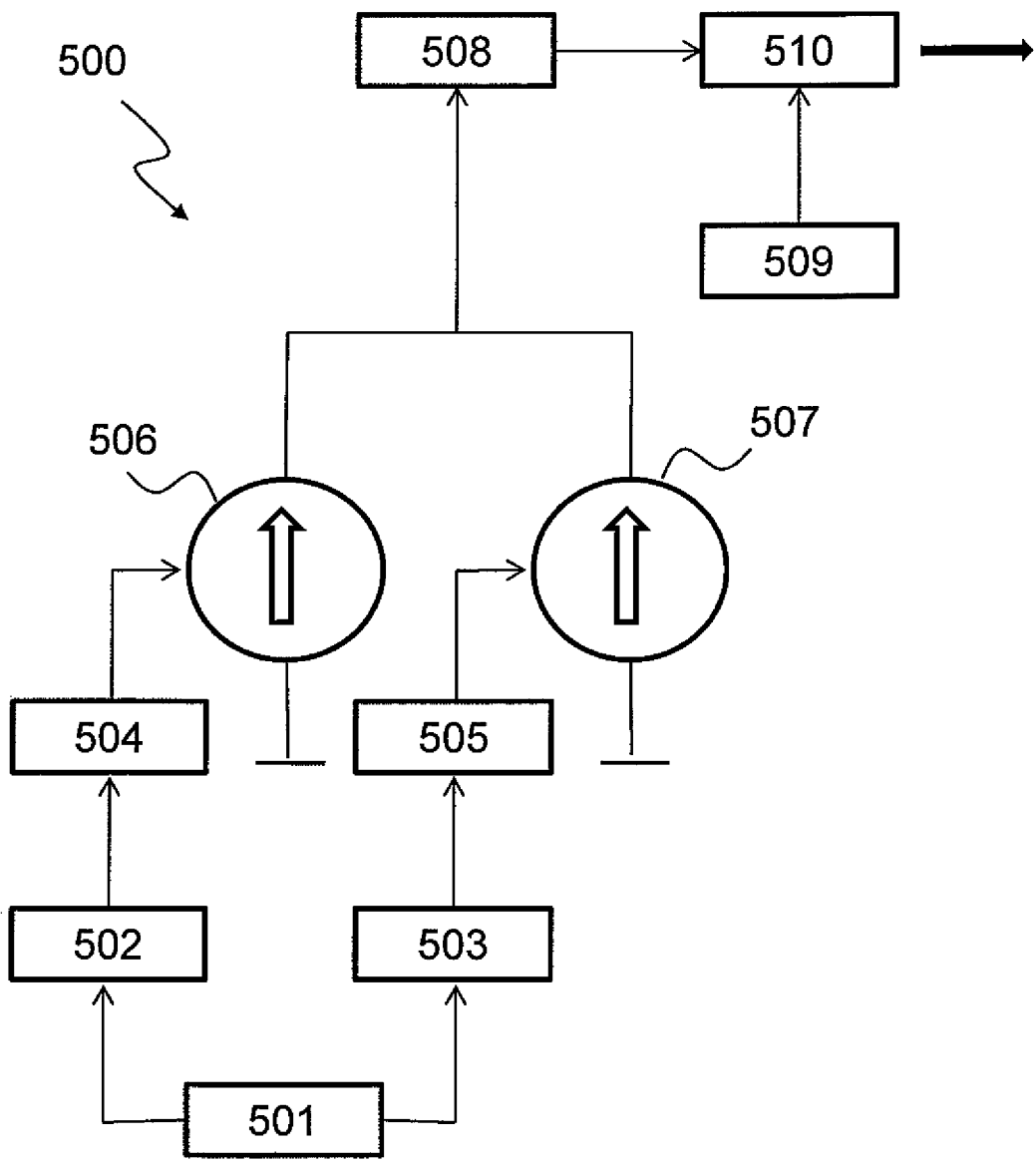
FIG. 5A shows an example of an optical pulse transmitter in accordance with an embodiment of the present invention.

FIG. 5A shows an example of an optical pulse transmitter 500 in accordance with an embodiment of the present invention. A triggering device 501 is employed to initiate drive signals for a seed laser, or laser diode, 508. By using electrical delay lines 502, 503, pulse generators 504, 505 can be controlled with respect to timing of generated pulses, wherein the timing of the pre-drive signal and the main drive signal supplied to the seed laser via current sources 506, 507 can be carefully chosen. The triggering device generates a trigger signal which is delayed through the respective delay line such that two delayed versions of the trigger signal are created, one to be supplied for producing the pre-drive signal and the other for producing the main drive signal. The optical pulse transmitter 500 may for example be realized with an Er-doped fiber amplifier (EDFA) 510 operating at a wavelength of about 1550 nm, or at a wavelength of about 1550±20 nm, where eye-safe operation is possible at a very high peak power. The EDFA is optically pumped with a pump laser 509. The output pulse of the EDFA is indicated in the figure by means of a bold arrow. This optical output pulse is subsequently used for performing EDM.

Figure 5B:
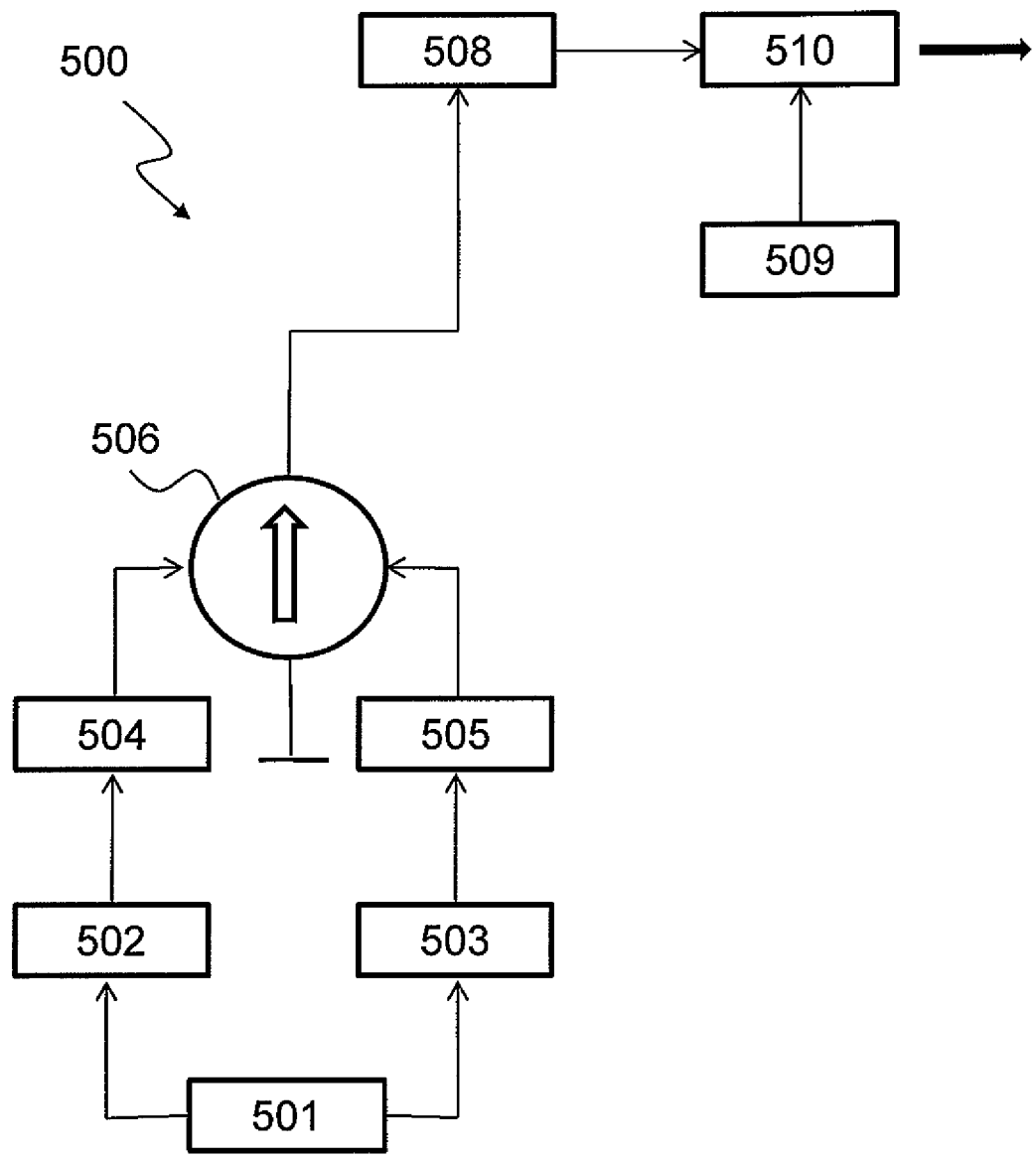
FIG. 5B shows an example of an optical pulse transmitter in accordance with another embodiment of the present invention.

Another implementation of the optical pulse transmitter is shown in FIG. 5B. Here, only one current source 506 is used which is providing both the pre-drive and the drive signals to the seed laser. The source 506 is controlled by the two pulse generators 504 and 505 like those in the foregoing example.

Further, the optical pulse transmitter 500 typically comprises one or more microprocessors (not shown) or some other device with computing capabilities, e.g. an application specific integrated circuit (ASIC), a field programmable gate array (FPGA), a complex programmable logic device (CPLD), etc., in order to perform operations such as controlling the triggering device 501 for initiating drive signals for the seed laser, or laser diode, 508. When performing steps of different embodiments of the method of the present invention, the microprocessor typically executes appropriate software that is downloaded to the transmitter and stored in a suitable storage area, such as e.g. a RAM, a Flash memory or a hard disk. Such a microprocessor or processing unit may alternatively or optionally be located externally relatively to the optical pulse transmitter (and electrically connected to the optical pulse transmitter).

Figure 6:
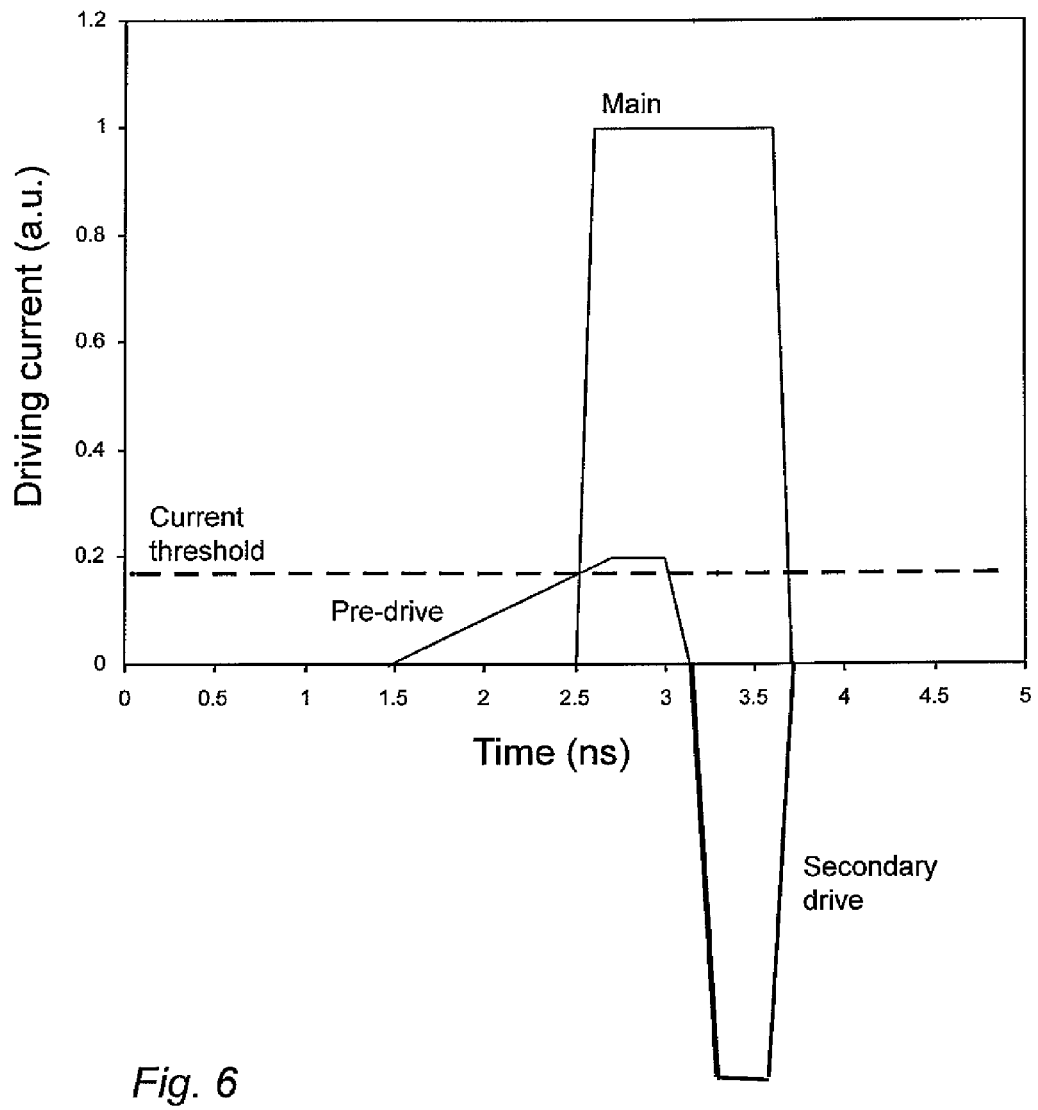
FIG. 6 shows an example of a pre-drive signal, a secondary drive signal and a main drive signal.

FIG. 6 shows a further example of generated drive signals in accordance with an embodiment of the present invention. Assuming that the main drive signal does not fall off with the same high rate with which the main drive signal is rising, a secondary drive signal may be generated having a negative amplitude. The absolute value of the negative amplitude may for example be comparable to, or higher than, the amplitude of the main drive signal. The secondary drive signal typically commences when the pre-drive signal reaches zero or later. The generation of the secondary drive signal facilitates a fast removal of injected carriers in the seed laser and therefore shortens pulse width. A secondary drive signal would require a third delay line, pulse generator and current source, respectively, in the transmitter of FIG. 5A or 5B. The secondary drive signal is indicated in bold in FIG. 6.

Figure 7:
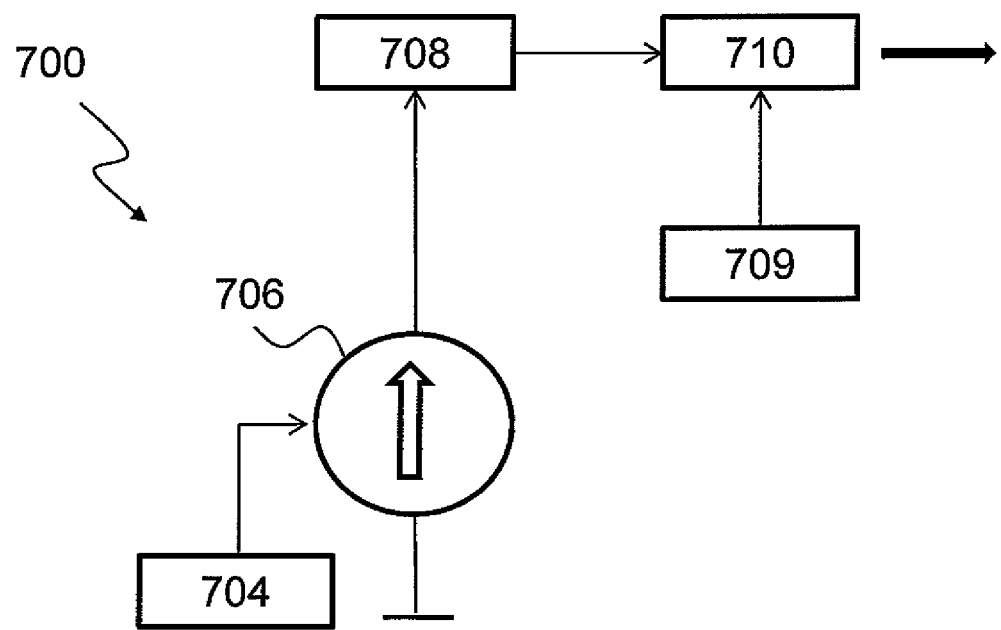
FIG. 7 shows an example of an optical pulse transmitter in accordance with a further embodiment of the present invention.

FIG. 7 shows an example of an optical pulse transmitter 700 in accordance with a further embodiment of the present invention. Pulse generator 704 produces the pre-drive signal and the main drive signal supplied to a seed laser, or laser diode, 708 via current source 706. The optical pulse transmitter 700 comprises an EDFA 710 optically pumped with a pump laser 709. Since only one pulse generator 704 is used in this embodiment, the pre-drive signal and the main drive signal will be supplied as a composite signal provided to the seed laser 708 via the same signal path.

Figure 8:
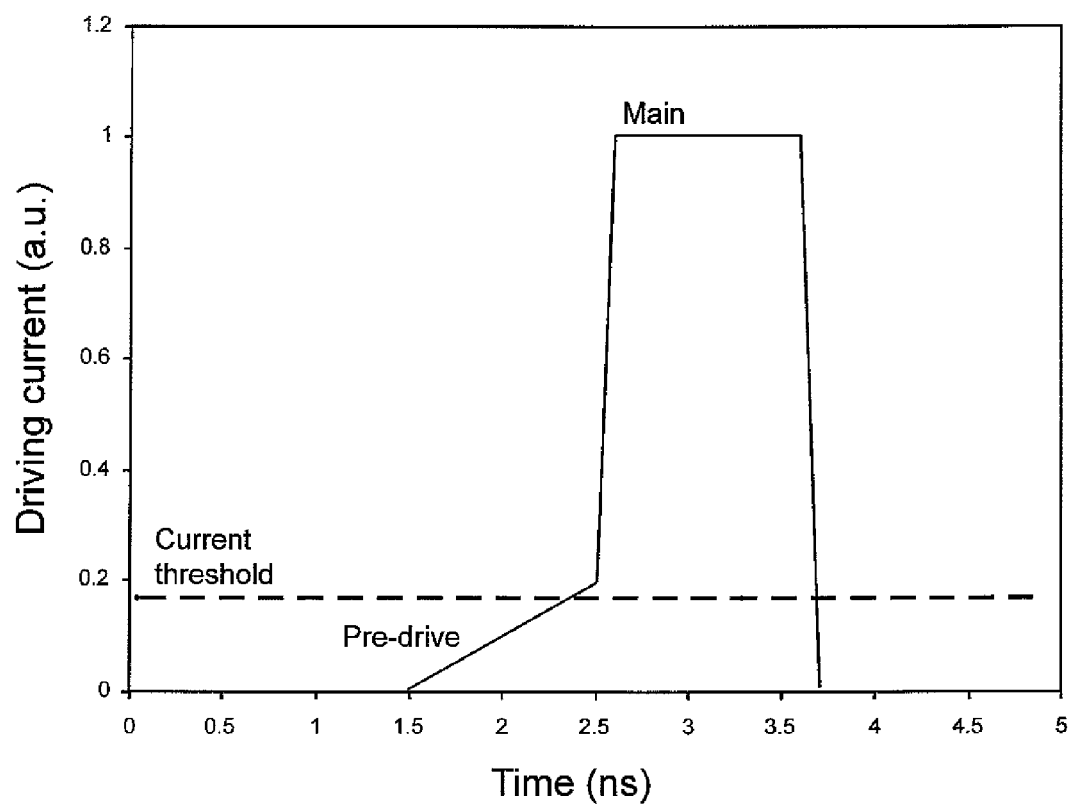
FIG. 8 illustrates an example of a pre-drive signal and a main drive signal generated in the optical pulse transmitter of FIG. 7.

FIG. 8 illustrates an example of a pre-drive signal and a main drive signal generated in the optical pulse transmitter of FIG. 7.

Even though the invention has been described with reference to specific exemplifying embodiments thereof, many different alterations, modifications and the like will become apparent for those skilled in the art. The described embodiments are therefore not intended to limit the scope of the invention, as defined by the appended claims. Any reference signs in the claims should not be construed as limiting the scope.

The invention claimed is:

1. A method of driving a laser diode, the method comprising:
   generating a pre-drive signal;
   generating a main drive signal, wherein the generating a pre-drive signal generates the pre-drive signal such that the current level of the pre-drive signal is kept at a value equal to or higher than the laser current threshold value for such duration of time that the number of carriers injected in the laser approaches an equilibrium level before the main drive signal is applied; and
   applying the pre-drive signal and the main drive signal to the laser diode, wherein said pre-drive signal mitigates spiking effects in the laser optical output.

2. The method according to claim 1, wherein the generating a main drive signal generates a duty cycle of the main drive signal such that the duty cycle is less than about 1 percent.

3. The method according to claim 1, wherein the generating a pre-drive signal is generated such that the duration of the pre-drive signal is longer than a characteristic time of the laser diode.

4. The method according to claim 1, wherein the applying applies the pre-drive signal and the main drive signal such that an amplitude of said pre-drive signal reaches zero before the amplitude of said main drive signal reaches zero.

5. The method according to claim 1, wherein the applying applies the pre-drive signal and the main drive signal such that an amplitude of said pre-drive signal reaches zero after the amplitude of said main drive signal reaches zero.

6. The method according to claim 1, further comprising operating the laser diode in one of a single mode and multiple modes.

7. An optical pulse transmitter, comprising:
   a laser diode;
   at least one pulse generator configured to generate drive signals for driving the laser diode; and
   at least one current source via which the drive pulses are supplied to the laser diode, wherein the pulse generator is adapted to generate a pre-drive signal adapted to mitigate spiking effects in the laser optical output, the pre-drive signal being generated such that the current level of the pre-drive signal is kept at a value equal to or higher than the laser current threshold value for such duration of time that the number of carriers injected in the laser diode approaches an equilibrium level before a main drive signal is applied to the laser diode.

8. The optical pulse transmitter of claim 7, further comprising an optically pumped amplifier configured to amplify a signal provided by the laser diode and output an optical output signal of the optical pulse transmitter.

9. The optical pulse transmitter of claim 8, wherein the optically pumped amplifier comprises a doped fiber amplifier.

10. The optical pulse transmitter of claim 9, wherein the doped fiber amplifier is doped with Nd, Yb, Er, Tm, Pr, Ho or any combination thereof.

11. The optical pulse transmitter of claim 9, wherein the doped fiber amplifier is adapted to operate in an eye-safe wavelength range.

12. The optical pulse transmitter according to claim 9, wherein the doped fiber-amplifier is adapted to operate within the wavelength interval 1.03-1.10 μm, 1.0-1.1 μm, 1.5-1.6 μm or 1.45-1.53 μm, or at a wave-length of about 1.3 μm or 2.1 μm.

13. The optical pulse transmitter of claim 7, wherein said pulse generator is adapted to generate said pre-drive signal such that a resulting optical output signal has an energy content that is less than a predetermined fraction of the energy content of an optical output signal resulting from said main drive signal.

14. The optical pulse transmitter of claim 7, wherein said pulse generator is adapted to generate said pre-drive signal such that a resulting optical output signal has an amplitude not higher than about 20% of the amplitude of the output optical signal resulting from said main drive signal.

15. The optical pulse transmitter of claim 7, wherein said pulse generator is adapted to generate said pre-drive signal such that a resulting optical output signal has a duration that is not longer than about 20% of the period of the output optical signal resulting from said main drive signal.

16. The optical pulse transmitter according claim 7, wherein the pulse generator is further adapted to generate the pre-drive signal such that the duration of the pre-drive signal is longer than a characteristic time of the laser diode.

17. The optical pulse transmitter of claim 7, further comprising:
   a trigger device configured to generate a trigger signal; and
   at least two electrical delay lines configured to control a timing of the trigger signal generated by the trigger device, wherein,
      the at least one pulse generator includes two pulse generators configured to generate drive signals for driving the laser diode, one pulse generator generating the pre-drive signal and the other pulse generator generating the main drive signal,
      the trigger signal is used for initiating the drive signals to be generated by the pulse generators,
      the at least one current source includes two current sources via one of which the pre-drive signal is to be supplied to the laser diode and via one of which the main drive signal is to be supplied to the laser diode, and
      one delay line is configured to supply a first delayed trigger signal to the pulse generator configured to generate the pre-drive signal, and the other delay line is configured to supply a second delayed trigger signal to the pulse generator configured to generate the main drive signal.

18. The optical pulse transmitter of claim 17, wherein,
   the at least one pulse generator includes a third pulse generator configured to generate a secondary drive signal for driving the laser diode,
   the at least one current source includes a third current source via which the secondary drive signal is to be supplied to the laser diode, and
   the at least two electrical delay lines include a third electrical delay line configured to supply a third delayed trigger signal to the third pulse generator configured to generate the secondary drive signal, thereby facilitating fast decrease of current through the laser diode.

19. The optical pulse transmitter of claim 18, wherein the secondary drive signal has a negative amplitude, the absolute value of the negative amplitude being equal to or greater than the amplitude of the main drive signal, and the third pulse generator is configured to supply the secondary drive signal when the pre-drive signal reaches zero or later.

20. A total station comprising the optical pulse transmitter according to claim 7.

21. A non-transitory computer-readable digital storage medium comprising a computer program product comprising computer-executable components adapted to, when executed on a processing unit of a device, cause the device to perform the method according to claim 1.

* * * * *